(12) United States Patent  
Schuller et al.

(10) Patent No.: US 9,419,209 B2
(45) Date of Patent: Aug. 16, 2016

(54) MAGNETIC AND ELECTRICAL CONTROL OF ENGINEERED MATERIALS

(71) Applicant: The Regents of the University of California, Oakland, CA (US)

(72) Inventors: Ivan K. Schuller, San Diego, CA (US); Jose de La Venta Granda, Fort Collins, CO (US); Siming Wang, La Jolla, CA (US); Gabriel Ramirez, San Diego, CA (US); Mikhail Erekhinskiy, San Diego, CA (US); Amos Sharoni, Shoham (IL)

(73) Assignee: The Regents Of The University Of California, Oakland, CA (US)

( * ) Notice: Subject to any disclaimer, the term of this patent is extended or adjusted under 35 U.S.C. 154(b) by 0 days.

(21) Appl. No.: 14/571,015

(22) Filed: Dec. 15, 2014

(65) Prior Publication Data

US 2015/0207060 A1   Jul. 23, 2015

Related U.S. Application Data

(60) Provisional application No. 61/915,715, filed on Dec. 13, 2013.

(51) Int. Cl.
*H01L 43/10* (2006.01)
*H01F 10/32* (2006.01)
*H01L 43/08* (2006.01)

(52) U.S. Cl.
CPC ............ *H01L 43/10* (2013.01); *H01F 10/3254* (2013.01); *H01L 43/08* (2013.01)

(58) Field of Classification Search
CPC .......... H01L 43/00; H01L 39/12; H01L 39/24
USPC ........................................................... 257/77
See application file for complete search history.

(56) References Cited

U.S. PATENT DOCUMENTS

| 7,211,199 | B2* | 5/2007 | Chen .................. G11C 11/5685 252/500 |
| 8,759,257 | B2* | 6/2014 | Gilbert ..................... H01L 39/12 505/470 |
| 2009/0315724 | A1* | 12/2009 | Kim ...................... H01L 49/003 340/584 |
| 2014/0238013 | A1* | 8/2014 | Wu ............................. F03G 7/06 60/528 |
| 2015/0044084 | A1* | 2/2015 | Hofmann ................ B32B 15/01 419/7 |

* cited by examiner

*Primary Examiner* — Michael Lebentritt
(74) *Attorney, Agent, or Firm* — Perkins Coie LLP

(57) ABSTRACT

Methods, systems, and devices are disclosed for controlling the magnetic and electrical properties of materials. In one aspect, a multi-layer structure includes a first layer comprising a ferromagnetic or ferrimagnetic material, and a second layer positioned within the multi-layer structure such that a first surface of the first layer is in direct physical contact with a second surface of the second layer. The second layer includes a material that undergoes structural phase transitions and metal-insulator transitions upon experiencing a change in temperature. One or both of the first and second layers are structured to allow a structural phase change associated with the second layer cause a change magnetic properties of the first layer.

27 Claims, 12 Drawing Sheets

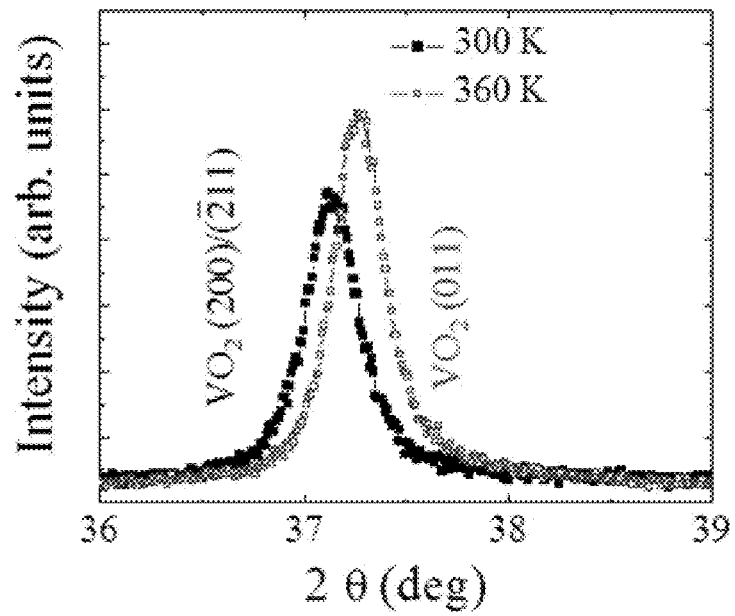
FIG. 6(a)
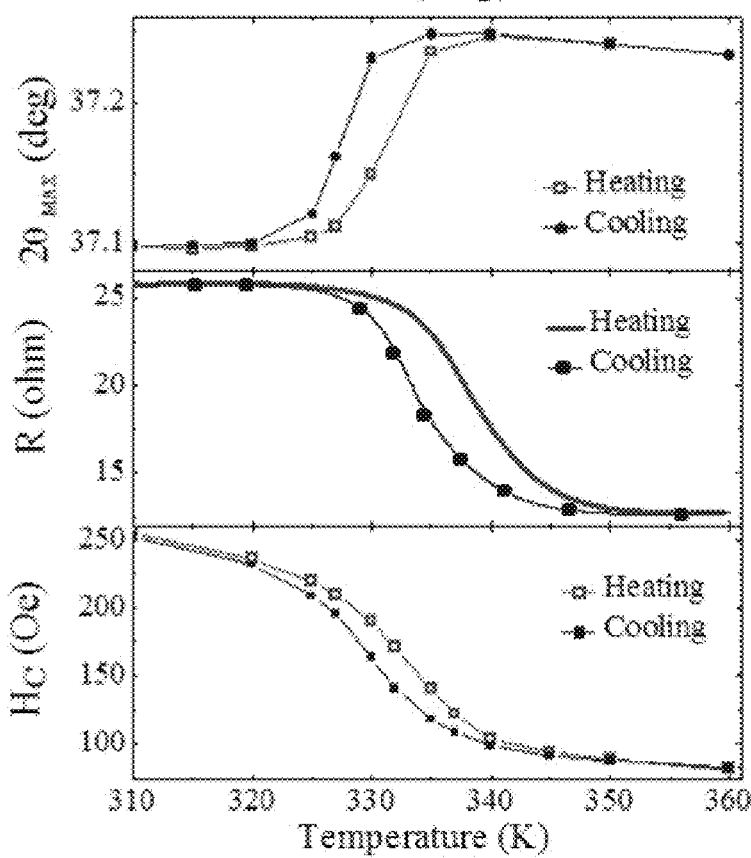
FIG. 6(b)
FIG. 6(c)
FIG. 6(d)

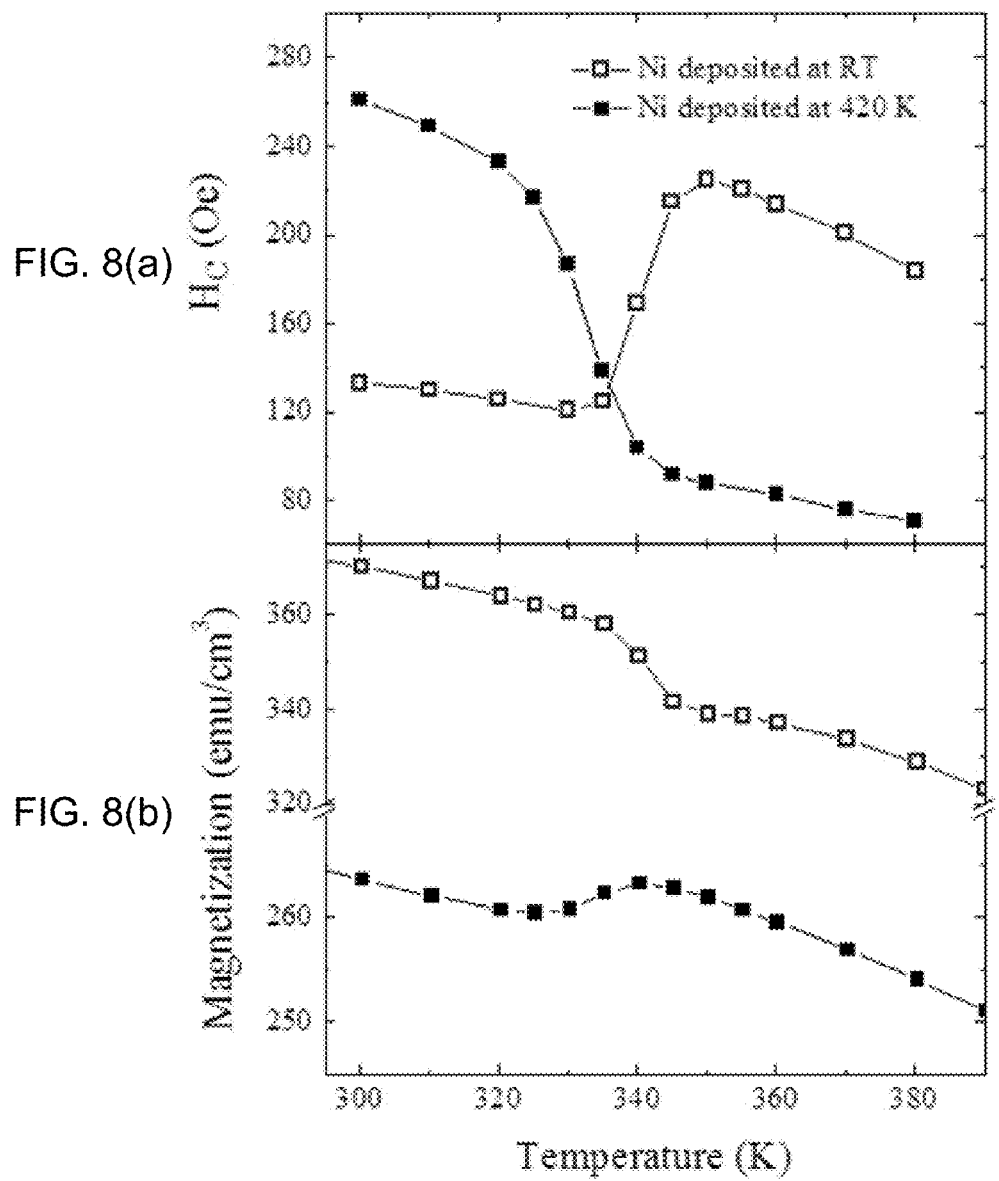

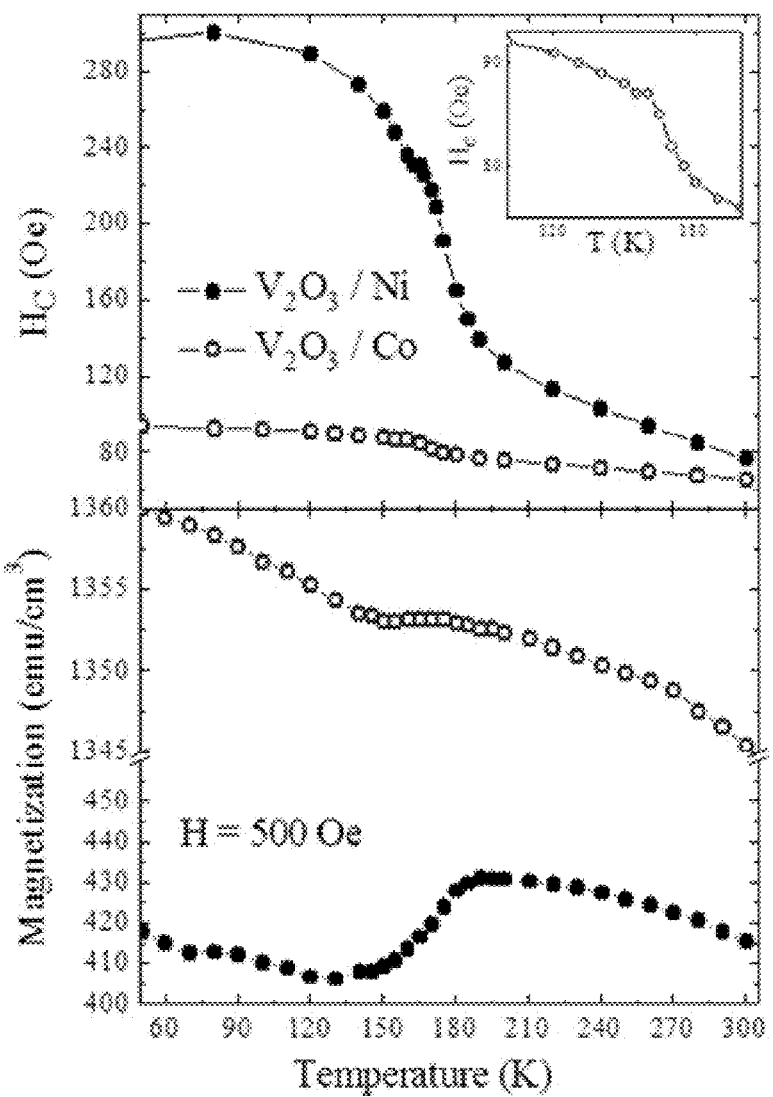
FIG. 9(a)
FIG. 9(b)
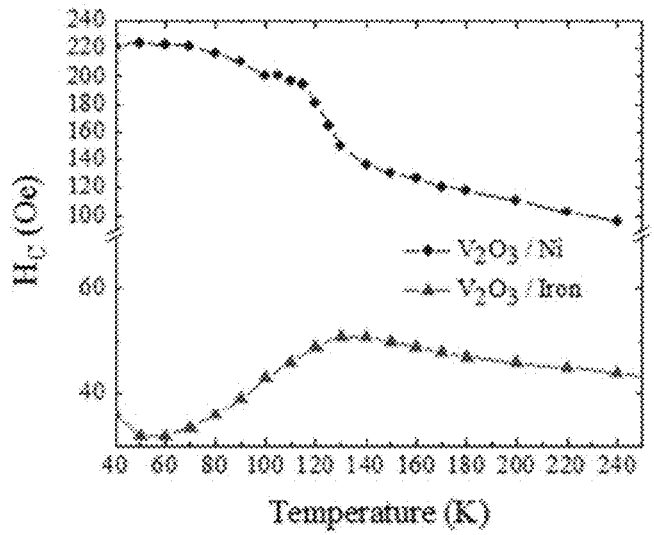
FIG. 9(c)

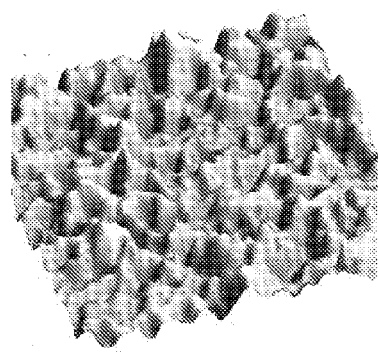
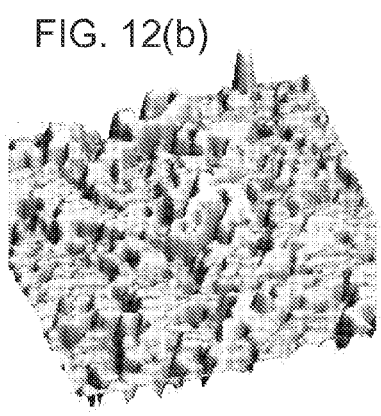
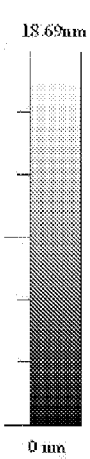
FIG. 12(a)  FIG. 12(b)
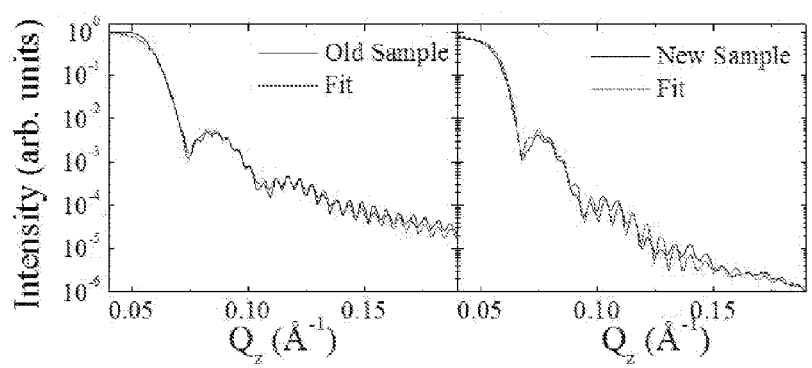
FIG. 12(c)  FIG. 12(d)

MAGNETIC AND ELECTRICAL CONTROL OF ENGINEERED MATERIALS

CROSS REFERENCE TO RELATED APPLICATIONS

This application claims priority to provisional application No. 61/915,715, entitled "MAGNETIC AND ELECTRICAL CONTROL OF ENGINEERED MATERIALS," filed on Dec. 13, 2013. The entire contents of the above noted provisional application are incorporated by reference as part of the disclosure of this document.

STATEMENT REGARDING FEDERALLY SPONSORED RESEARCH OR DEVELOPMENT

This invention was made with government support under grant DE-FG03-87ER45332 awarded by the US Department of Energy (DOE). The government has certain rights in the invention.

TECHNICAL FIELD

This patent document relates to magnetic materials and particularly to methods, systems and devices that control magnetic and electrical characteristics of engineered material.

BACKGROUND

Various magnetic materials exhibit magnetic hysteresis which can be represented on a magnetization curve of a magnetic flux density (B) as a function of the applied magnetic field intensity (H). The size and shape of the hysteresis curve provide measurements of the magnetic properties of the material. Soft magnetic materials are magnetically soft and can be relatively easy to magnetize by applying an external magnetization field. Such soft magnetic materials can exhibit small hysteresis loops, e.g., in which the properties of soft magnetic materials can include a high initial permeability and low coercivity. Hard magnetic materials tend to maintain their initial magnetization and thus are relatively difficult to change their initial magnetization by applying an external magnetization field. Hard magnetic materials can exhibit large hysteresis loops, e.g., in which the properties of hard magnetic materials can include a high remanence, high saturation flux density, and high coercivity. In applications, hard magnetic materials with a high resistance to demagnetization can be used to construct permanent magnets. The area within a hysteresis loop can represent a magnetic energy. The magnetic hysteresis curve of a magnetic material can be used to identify important magnetic characteristics of the material including coercivity (e.g., FL, which is the H value at which B is zero) and magnetic energy product (e.g., $(BH)_{max}$, which corresponds to the maximum area of a B–H rectangle within the second quadrant (e.g., −H values, +B values) of the hysteresis curve), which can be used as a comparative measure of the magnet strength of a permanent magnet material.

Nanotechnology provides techniques or processes for fabricating structures, devices, and systems with features at a molecular or atomic scale, e.g., structures in a range of one to hundreds of nanometers in some applications. For example, nano-scale devices can be configured to sizes similar to some large molecules, e.g., biomolecules such as enzymes. Nano-sized materials can be used to create a nanostructure, a nanodevice, or a nanosystem that can exhibit various unique properties that are not present in the same materials scaled at larger dimensions and such unique properties can be exploited for a wide range of applications.

SUMMARY

Techniques, systems, devices and materials are disclosed for controlling the magnetic and electrical properties of materials, e.g., by growing magnetic films on top of materials that undergo structural phase transitions (SPT) and metal-insulator transitions (MIT) (also sometime referred to as insulator-metal transitions (IMT)), in which these transitioning "active layers" can be used in read/write processes for magnetic memory or transistor devices.

In one aspect, a multi-layer structure includes a first layer comprising a ferromagnetic or ferrimagnetic material, and a second layer positioned within the multi-layer structure such that a first surface of the first layer is in direct physical contact with a second surface of the second layer. The second layer includes a material that undergoes structural phase transitions and metal-insulator transitions upon experiencing a change in temperature, where one or both of the first and second layers are structured to allow a structural phase change associated with the second layer cause a change magnetic properties of the first layer.

The subject matter described in this patent document can be implemented in specific ways that provide at least the following features. For example, the disclosed technology can be implemented in applications including, but not limited to, heat-assisted magnetic recording (HAMR), thermomagnetic recording, magnetooptical disk (MOD) technologies, and spintronic devices, which are based on changes in the magnetic parameters (e.g., coercive field, magnetization) when the samples are heated and cooled.

BRIEF DESCRIPTION OF THE DRAWINGS

FIG. 6(a) shows exemplary plots of an XRD pattern at 300 and 360 K for 100 nm $VO_2$/10 nm Ni bilayer.

FIG. 6(b) shows exemplary plots of the $VO_2$ Bragg peak position vs. T.

FIG. 6(c) shows exemplary plots of the R vs. T curve.

FIG. 6(d) shows exemplary plots of the coercivity vs. T curve.

FIG. 8(a) shows exemplary data plots of the dependence of coercivity with temperature for bilayers of 100 nm of $VO_2$ and 10 nm of Ni.

FIG. 8(b) shows exemplary data plots of in-plane magnetization versus temperature measured at 1000 Oe.

FIG. 9(a) shows exemplary data plots of the dependence of coercivity with temperature for bilayers of 100 nm of $V_2O_3$ and 10 nm of Ni and Co.

FIG. 9(b) shows exemplary data plots of in-plane magnetization versus temperature measured at 500 Oe.

FIG. 9(c) shows exemplary data plots of coercivity vs. temperature plot for $V_2O_3$/Ni and $V_2O_3$/Fe bilayers.

FIG. 12(a) shows exemplary data plots of an atomic force microcopy image of a layer with an rms roughness of approximately 3 nm.

FIG. 12(b) shows exemplary data plots of an atomic force microscopy image of a layer with an rms roughness of approximately 1.5 nm.

FIG. 12(c) shows exemplary data plots of X-ray reflectivity (XRR) data (and fit) for the samples roughness of 3 nm.

FIG. 12(d) shows exemplary data plots of XRR data (and fit) for the samples with roughness of 1.5 nm.

DETAILED DESCRIPTION

Figure 1:
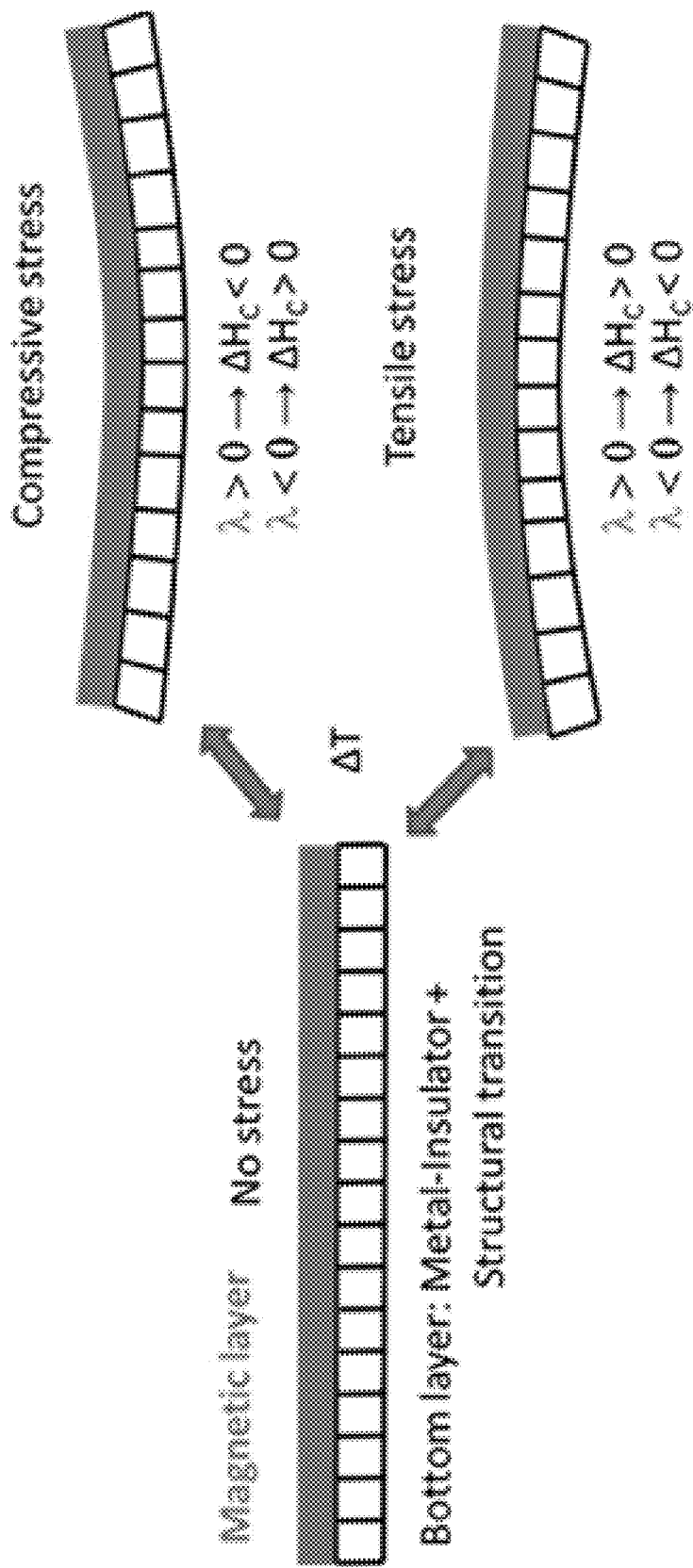
FIG. 1 is a schematic showing the strain caused by the structural phase transition of the bottom layer.

Controlling magnetic and electrical properties of films is an extremely important area in magnetic storage and magnetic recording. Many materials can undergo structural phase transition in which the crystal structure changes. For some materials, there may be an associated metal-insulator transition, as well. The transition can be generally temperature driven and reversible. In some cases the transition could be also induced electrically by current or voltage or light.

Generally, the control of magnetic and electrical properties of films is achieved independently. For example, to tune the magnetic properties of magnetic layers, different approaches have been used, such as using antiferromagnetic/ferromagnetic bilayers, embedding nanoparticles, ion damaging, or applying mechanical stress using piezoelectric actuators. The control of electrical properties is usually achieved by doping. Using multiferroic materials is also possible to control magnetic and electrical properties of materials with electrical fields.

In magnetic materials, there is a monotonic decrease with increasing temperature in important magnetic parameters such as coercivity $H_c$ (the applied magnetic field required to switch half of the magnetization). Thus large temperature excursion, with the consequent large heat dissipations, are needed to change the relevant properties. Structural phase transitions are sharp and occur in very narrow temperature ranges. In the disclosed technology, large values of epitaxial stress are applied to the magnetic films in small temperature ranges. This can be implemented to obtain large changes in magnetic properties, such us the coercive field in very narrow temperature ranges.

In one aspect, the disclosed technology employs inverse magnetostrictive (or magnetomechanical) effects, structural phase transitions and metal to insulator transitions to control the electrical and magnetic properties of materials, e.g., such as layered magnetic materials.

Magnetostrictive effects can produce change in the dimensions of a sample when a magnetic field is applied. The inverse effect is the change in magnetization due to an applied stress. The effect is characterized by the magnetostrictive coefficient, $\lambda$. For example, a material with negative $\lambda$ will contract when magnetized, and a material with positive $\lambda$ will elongate when magnetized. Applied compressive stress, which tends to contract it, will therefore increase the magnetization, and applied tensile stress will decrease it. Structural phase transitions (SPT) are changes in the crystal structure of certain materials. These changes produce a volume expansion (or contraction). This volume expansion is usually a few percentage of the volume and can produce stresses of the order of hundreds of MPa. Metal-insulator transitions (MIT) are changes in the resistivity of a material from a metal (good electrical conductivity) to an insulator (bad electrical conductivity). Many times MIT are related to SPT.

In the disclosed technology, magnetic films are grown on top of materials that undergo SPT. The variation in temperature induces large changes in the structure of the SPT /material. This stress is transferred into the magnetic layer which is in intimate contact with the SPT material. FIG. 1 shows the epitaxial strain experienced by the ferromagnetic films due to changes in temperature.

The epitaxial strain in the magnetic film will give rise to an increase (or decrease) of the coercive field. Full control is achieved by choosing magnetic materials with different $\lambda$ values and SPT material with different transitions (tensile to compressive or vice versa). Thus, depending on the type of stresses and the characteristics of the magnetic layer, it is possible to induce an increase (or decrease) in the coercive field.

Figure 2A:
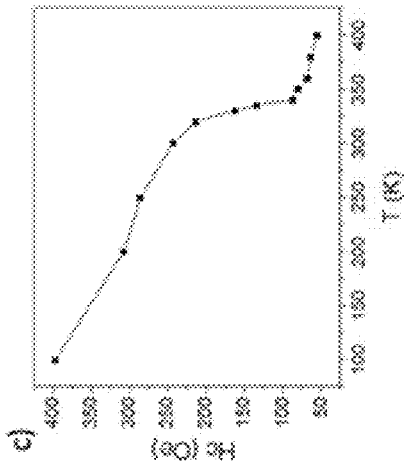
FIG. 2(a) shows exemplary data plots of monotonic decrease with temperature of coercivity in material used in thermomagnetic recording.
Figure 2B:
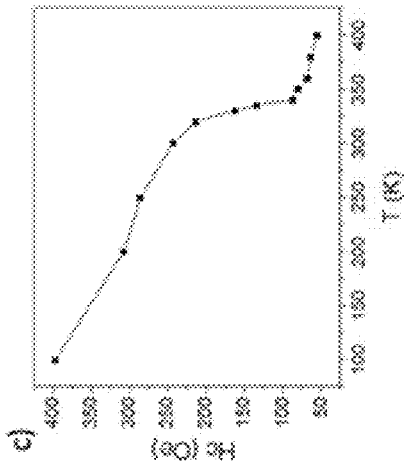
FIG. 2(b) shows exemplary plots of monotonic decrease with temperature of coercivity in a nickel film.
Figure 2C:
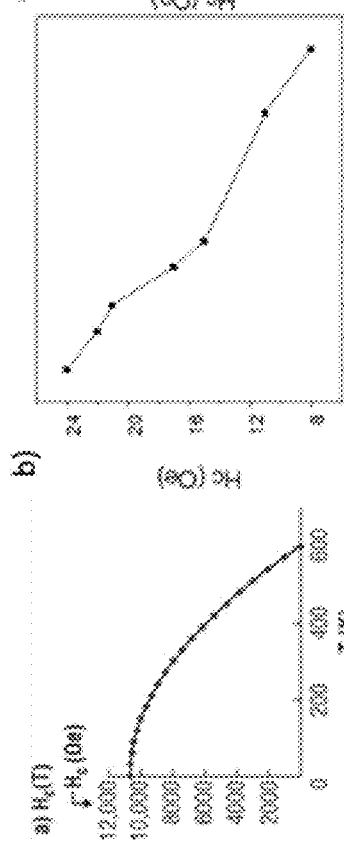
FIG. 2(c) shows exemplary plots of coercivity vs. temperature for an exemplary vanadium dioxide/nickel sample.

FIG. 2 shows data plots of (a) monotonic decrease with temperature of coercivity in material used in thermomagnetic recording; (b) monotonic decrease with temperature of coercivity in a nickel film; and (c) coercivity vs. temperature for an exemplary vanadium dioxide ($VO_2$)/nickel sample (e.g., vanadium dioxide/nickel bilayers) that are produce in accordance with the disclosed techniques. Heating the sample induces a sharp SPT on the $VO_2$ layer at around 340 K. The sharp transition produces large changes in the coercive field of the Nickel film in very narrow temperature ranges. FIG. 2(a) shows the usual monotonic decrease of the coercive field with the temperature in a magnetic materials used in thermomagnetic recording. FIG. 2(b) shows the behavior of a Nickel thin film grown in a standard substrate. In contrast, FIG. 2(c) shows that the epitaxial stress associated with the SPT causes at a sharp decrease of the coercive field (70% in 10 degree).

Figure 3A:
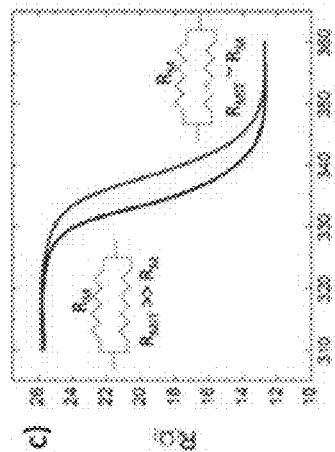
FIG. 3(a) shows an exemplary schematic of the bilayers.
Figure 3B:
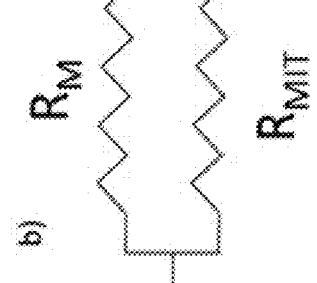
FIG. 3(b) shows an exemplary model of two resistor in parallel.
Figure 3C:
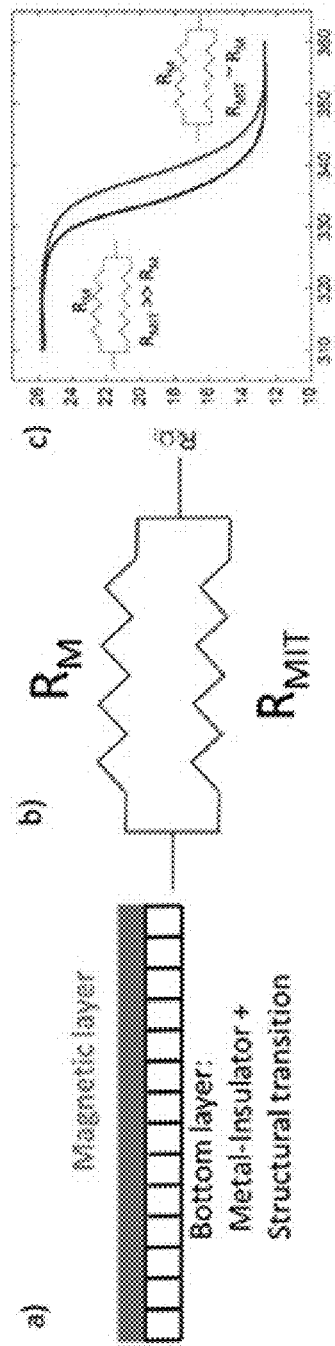
FIG. 3(c) shows an exemplary data plot of the resistance vs. temperature.

An exemplary model can be used to describe how to control the electrical properties simultaneously, as shown in FIG. 3. FIG. 3(a) shows an exemplary schematic of bilayers. FIG. 3(b) shows an exemplary model of the bilayer that includes two resistor in parallel. FIG. 3(c) shows a plot of resistance vs. temperature for the same sample shown in FIG. 2(c), e.g., vanadium dioxide/Nickel. With reference to FIG. 3(a), the bottom layer exhibits a MIT associated with the SPT. The top magnetic layer and the bottom MIT layer can be represented as two different resistors in parallel as shown in FIG. 3(b). The total resistivity of the bilayer can be given as:

$$R_{total} = \frac{R_M \times R_{MIT}}{R_M + R_{MIT}}. \quad (1)$$

In Equation (1), $R_M$ represents the resistivity of the magnetic layer (i.e., the top layer of FIG. 3(a)), and $R_{MIT}$ represents the resistivity of the layer that exhibits MIT (i.e., the bottom layer of FIG. 3(a)). For example, when the bottom layer is in the metallic state, the two resistances are comparable, the current flows through both layers and the total resistance is low, e.g., $$R_{total} = \frac{R_M}{2}.$$

When the bottom layer is in the insulating state, $R_{MIT}$ is much larger than $R_M$. Thus almost all the current will flow through the magnetic metal and the total resistivity will be higher, e.g., $R_{total}=R_M$. FIG. 3(c) shows the resistivity vs. temperature data for the same real sample shown in FIG. 2(c).

Figure 4:
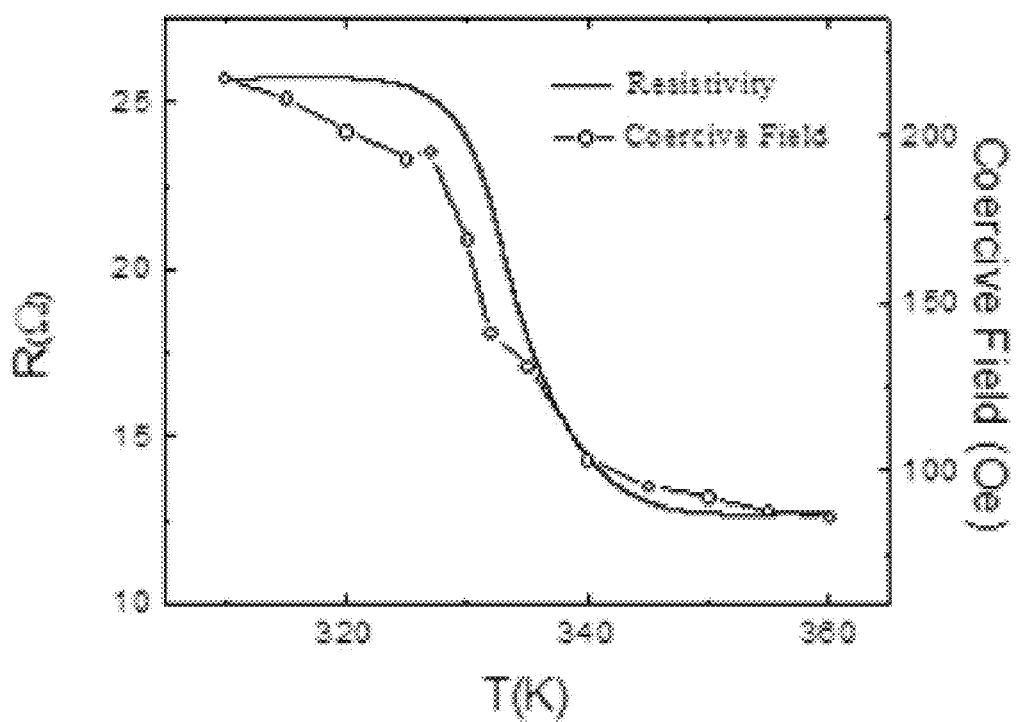
FIG. 4 shows an exemplary data plot showing the correlation between the changes in the resistivity and coercive field with temperature.

The control of the resistivity of the films offers another interesting option. As shown in FIG. 4, it is possible to measure the coercive field of the ferromagnet by correlating the stress induced change in electrical resistance. An analogy of this mechanism is the bolometer. FIG. 4 shows the correlation between the coercive field and the resistivity of the sample. Thus it is possible to determine one parameter (resistivity or coercive field) knowing the other.

The disclosed technology allows for multiple control of the coercive field and resistivity of the films. Exemplary control parameters include thicknesses of the different layers; magnetostricitive coefficient, λ, of the magnetic layer; stress across the transition (e.g., tensile or compressive); and changes in resistivity, e.g., insulator to metal or (vice versa) with temperature.

In some examples, bilayers including different vanadium oxides ($VO_2$ and $V_2O_3$) as the bottom layer and nickel, cobalt, iron and permalloy as top magnetic layer can be implemented. For example, the disclosed technology can be applied to any material that undergoes a structural phase transition and/or metal-insulator transition. Exemplary materials that undergo a MIT can include, but are not limited to, transition metal oxides, e.g., $V_2O_3$, $VO_2$, VO, $V_6O_{13}$, $V_3O_5$, $V_4O_7$, $TiO_3$, $Ti_3O_5$, $NbO_2$, $Fe_3O_4$, $Mo_9O_{26}$; sulfides, e.g., NiS, CrS, VS and FeS; and other compounds, e.g., $NiS_{2-x}Se_x$, $RNiO_3$, $NiS_{1-x}Se_x$, $BaVS_3$, $La_{1-x}Sr_xFeO_3$, FeSi and $LaCoO_3$. For example, for the top layer, any ferromagnetic or ferrimagnetic material could be used.

In some implementations, the disclosed technology can be used to effect thermomagnetic recording. The essence of thermomagnetic recording (e.g., the basis of heat-assisted magnetic recording (HAMR) and magnetooptical disk (MOD) technologies) uses a medium with tailored dependent magnetic properties. For writing, the magnetic medium is heated locally by a laser, which decrease the coercive field. Then, a small magnetic field can be used to switch the magnetization. Generally, the decrease in the coercivity with temperature is gradual. By implementing the disclosed technology, a sharp change in properties can be achieved which allows for a better control of the important parameters. In the disclosed technology, it is possible to control the both electrical and magnetic properties of the magnetic layer by the same method.

In one aspect of the disclosed technology, methods, materials, systems and devices are disclosed to (i) control and/or tailor the magnetic and electrical properties of magnetic films, e.g., by growing them on top of materials that undergo structural phase (SPT) and metal-insulator transitions (MIT) and (ii) to use such transitioning "active layers" in read/write processes for magnetic memory devices or transistor device.

Magnetic properties including coercivity and magnetization of ferromagnetic films are strongly affected by the proximity to materials that undergo a metal to insulator transition. In the disclosed technology, variation in temperature induces large stresses in the structure of the SPT layer, resulting in epitaxial strain in the magnetic film which then gives rise to an increase, or decrease, of the coercive field. This effect can be applied to thermal-assisted magnetic recording technology, which may be implemented, for example, in hard drives to increase storage capacities. Further, by transitioning the active layer from insulator to metal phase with an applied voltage, an exemplary device of the disclosed technology can be changed from a read state to a write state.

Controlling the magnetic properties of ferromagnetic (FM) layers without magnetic fields is an on-going challenge in condensed matter with multiple technological implications. External stimuli (e.g., light, electric field) and proximity effects (e.g., materials susceptible to external driving forces) are the most used methods to control the magnetic properties. For example, nanostructured materials in proximity with other dissimilar materials are particularly susceptible to external driving forces such as temperature, time varying electric and magnetic fields, electromagnetic waves, pressure, sound, stress, etc. These in turn produce a variety of new functionalities, which do not occur in nature. Examples of such structures include: piezoelectric-ferromagnetic, ferromagnetic-multiferroic and ferroelectric-ferromagnetic heterostructures. Similar effects can be produced by ferromagnets in proximity to materials that undergo a metal-insulator transition (MIT) and structural phase transition (SPT) that were described earlier. While, the SPT and MIT are usually driven by temperature, they may also be driven by current, light and pressure. Thus, if the magnetism of the FM is affected by the proximity to materials that undergo MIT, then tuning the magnetic properties by multiple stimuli can become possible.

For example, canonical examples of materials that undergo MIT and SPT are the vanadium oxides $VO_2$ and $V_2O_3$. More particularly, $VO_2$ exhibits a first order phase transition at ~340 K, from a low temperature insulating to a high temperature metallic phase. The resistance change can be as large as 4 orders of magnitude across the MIT. Concurrent with the MIT there is a structural change from a low temperature monoclinic to high temperature rutile phase. On the other hand, the transition in $V_2O_3$ at ~160 K is from a low temperature antiferromagnetic insulating phase to a high temperature paramagnetic metallic phase. The associated SPT is from monoclinic in the insulating phase to rhombohedral symmetry in the metallic phase, with a resistance change up to 5 orders of magnitude.

Exemplary implementations of the disclosed technology were constructed that demonstrated that the magnetic properties of FM films can be tailored and controlled using the SPT and MIT in $VO_2$ and $V_2O_3$. It is found that reproducible changes can be effectuated in the coercivity and magnetization in a variety of configurations. It is also shown that the magnetic properties can be modified by the deposition conditions and thickness of the ferromagnetic films. This can open up a new avenue for the study of ferromagnetic heterostructures and for the development of novel devices.

It is described and shown herein that stress associated with structural changes across the metal-insulator phase transition in, e.g., $VO_2$ and $V_2O_3$, produces a magnetoelastic anisotropy in proximity coupled ferromagnetic films (e.g., Co, Ni or Fe). The changes in coercivity are as large as 168% and occur in a very narrow temperature interval. This effect can be controlled and inverted by the thickness and the deposition temperature of the ferromagnetic films.

In some examples, samples were prepared in a high-vacuum sputtering deposition system with a base pressure of $1 \times 10^{-7}$ Ton. The $VO_2$ and $V_2O_3$ films were deposited at 600° C. and at 750° C. respectively by RF sputtering of a $V_2O_3$ target on r-cut (1012) sapphire ($\alpha$-$Al_2O_3$) substrates. The RF magnetron power was kept at 100 W and the total pressure was 4 mtorr. For $VO_2$ a mixture of ultra-high purity (UHP) Ar and $O_2$ was used. The oxygen partial pressure was 0.4 mtorr. For $V_2O_3$ only UHP Ar (4 mtorr) was used as sputtering gas. After recovering the base pressure, the Ni was deposited by RF sputtering from a Ni target at two different temperatures: 420 K and 300 K (room temperature, RT). Co was deposited at Room Temperature (RT) by e-beam evaporation in a vacuum system with a base pressure of $5 \times 10^{-7}$ ton. A capping layer of Cu or Al was deposited to prevent oxidization. X-ray diffraction (XRD) was performed with a Bruker D8 Discovery rotating anode diffractometer using Cu K$\alpha$ radiation. Magnetic characterization was performed using a Quantum Design superconducting quantum interference device magnetometer (SQUID) MPMS and a Vibrating Sample Magnetometer (VSM). The R vs. T characteristics were obtained from standard two probe measurements using a constant current source. Temperature was swept at constant rate of 1 K/min using a Lakeshore 332 temperature controller.

Figure 5:
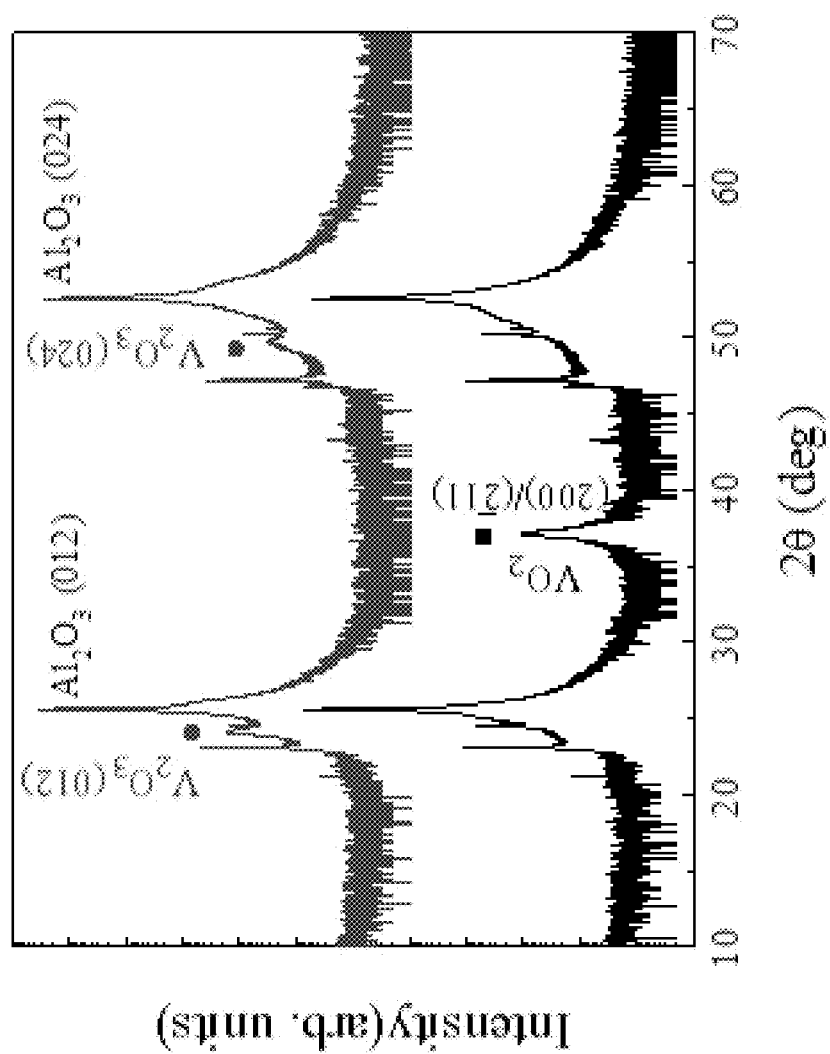
FIG. 5 shows an exemplary plot of an XRD pattern for 100 nm $VO_2$/10 nm Ni and 100 nm $V_2O_3$/10 nm Ni.

FIG. 5 shows an exemplary plot of an XRD pattern (Cu K$\alpha$, $\theta/2\theta$ geometry) for: (bottom) 100 nm $VO_2$/10 nm Ni and (top) 100 nm $V_2O_3$/10 nm Ni. $V_2O_3$ (dots), $VO_2$ (square) diffraction maxima are indexed in the figure. The sharp XRD peaks from the substrate. For visualization the curves are shifted along the Y axis.

FIG. 5 shows the X-ray Diffraction pattern for bilayers with 100 nm of $VO_2$ (or $V_2O_3$) and 10 nm of Ni. The $VO_2$ Bragg peak could be indexed as the (200) and ($\bar{2}11$) planes of the monoclinic phase. $V_2O_3$ grows epitaxial with the substrate along the (012) direction. The instrumental limitations prevent us to discriminate the 10 nm Ni film. However, for Ni films with 50 and 100 nm thicknesses we were able to determine that the Ni grown at RT is polycrystalline. On the other hand, the Ni film is textured along the (220) direction when deposited at 420 K on top of $VO_2$. This was concluded after extensive XRD studies using $\theta/2\theta$ scans, grazing incidence diffraction, rocking curves with different sample alignment. FIG. 6(a) shows the XRD pattern focused around the $VO_2$ Bragg peak at 360 K (i.e., the plot with hollow square markings) and at RT (i.e., the plot with filled square markings) for a 100 nm $VO_2$/10 nm Ni bilayer. Above the SPT, the Bragg peak at 37.27 degrees corresponds to the (011) planes of the rutile phase. Below the SPT the $VO_2$ Bragg peak shifted to 37.12 degrees and corresponds to the (200) and ($\bar{2}11$) planes of the monoclinic phase. The evolution of the Bragg peak with the temperature is depicted in FIG. 6(b). Across the MIT transition, the resistance changes shows the typical $VO_2$ thermal hysteresis, FIG. 6(c). FIG. 6(d) shows a plot of the coercivity vs. T curve.

Figure 7A:
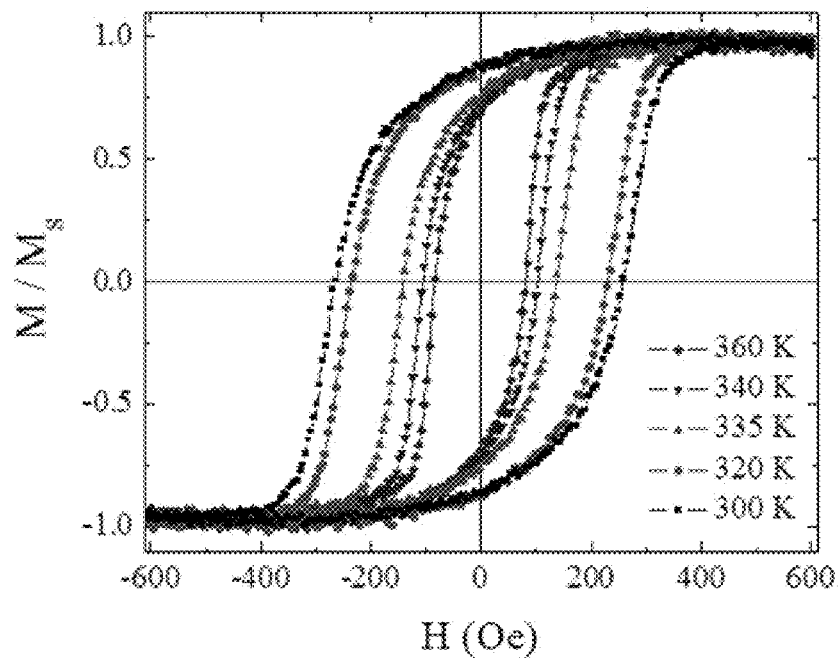
FIG. 7(a) shows exemplary data plots of an in-plane hysteresis loops at various temperatures for a 100 nm $VO_2$/10 nm Ni bilayer.
Figure 7B:
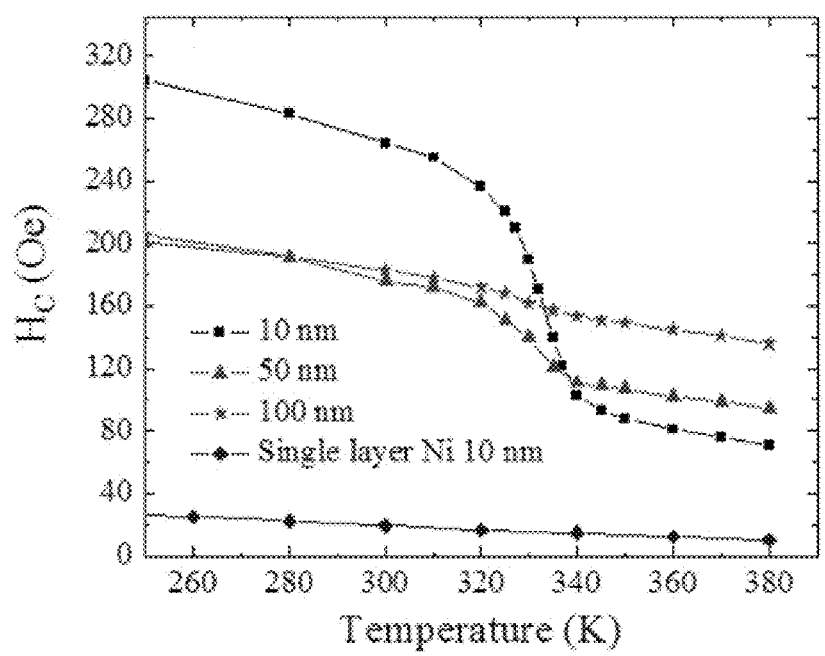
FIG. 7(b) shows exemplary data plots of a coercivity vs. temperature for a 10 nm Ni film and bilayers of 100 nm $VO_2$ and different Ni thicknesses.

FIG. 7(a) shows the magnetization vs. field curves (in-plane hysteresis loops) at various temperatures for a 100 nm $VO_2$/10 nm Ni bilayer. FIG. 7(b) shows a coercivity vs. temperature for a 10nm Ni film (diamonds) and bilayers of 100 nm $VO_2$ and different Ni thicknesses: 10 nm (squares), 50 nm (triangles) and 100 nm (stars). The Ni layer was deposited at 420 K. The most striking effect is the large increase in coercivity ($H_c$) in a narrow temperature range from e.g., 350 to 320 K, which is shown as filled squares in FIG. 7(b). For a comparable 10 nm Ni film there is a not surprising linear dependence of the coercivity with temperature, which is shown as the bottom curve with diamonds in FIG. 7(b). For our $VO_2$/Ni bilayers, the increase in the coercive field from 350 to 320 K is up to 168% (from 88 to 236 Oe). The magnitude of the change in coercivity increases with decreasing Ni thickness (as shown in FIG. 7(b) for three different thicknesses), indicating that this is an interface effect. So the change in coercivity can be controlled with the Ni thickness. For instance, the 350 to 320 K coercivity increase is 51% and 15% for 50 and 100 nm Ni, respectively. The SPT and MIT in $VO_2$ at ~340 K, are correlated with the changes in coercivity and magnetization as shown in FIG. 6. The coercivity (FIG. 6(d)) tracks closely the SPT and MIT, (FIGS. 6(b) and 6(c)) and shows the same thermal hysteresis.

The changes in magnetic properties across the MIT can also be tuned by the growth conditions. The previous results were obtained when the Ni was grown at 420 K, e.g., on the $VO_2$ in the metallic rutile phase. FIG. 8(a) shows an exemplary data plot showing dependence of coercivity with temperature for bilayers of 100 nm of $VO_2$ and 10 nm of Ni. FIG. 8(b) shows an exemplary plot of in-plane magnetization versus temperature measured at 1000 Oe. The Ni was deposited at 420 K (solid squares) and at RT (hollow squares). When the Ni was deposited at RT on $VO_2$ in the insulating monoclinic phase, the coercivity change reverses, e.g., decreases by 44% with decreasing the temperature from 350 to 320 K (e.g., hollow symbols in FIG. 8(a)). The behavior is opposite for the bilayers with the Ni deposited at 420 K (e.g., filled squares in FIG. 8(a)). In addition, the magnetization changes with temperature in the two samples is also opposite as shown in FIG. 8(b). When cooling across the MIT, the Ni magnetization grown at RT increases while it decreases for the Ni deposited at 420 K. Thus the growth temperature provides an additional reproducible and repeatable control parameter. We measured R vs. T curves, as well as XRD patterns, at temperatures below and above the transition. The $VO_2$ MIT and SPT occur in the same way independently of the Ni deposition temperature. Thus, the differences in the magnetic properties of Ni are due to the different Ni structure and how it responds to the stress across the $VO_2$ MIT.

To investigate the generality of these effects we studied $V_2O_3$/FM bilayers using $V_2O_3$ that shows SPT and MIT at ~150 to 160 K. Films of 10 nm Ni or Co in proximity to 100 nm of $V_2O_3$ behave similarly to $VO_2$ bilayers but at the $V_2O_3$ MIT temperature, as shown in the data plots of FIG. 9. FIG. 9(a) shows an exemplary data plot of the dependence of coercivity with temperature for bilayers of 100 nm of $V_2O_3$ and 10 nm of Ni (solid dots) and Co (empty dots). The insert in upper right hand corner of FIG. 9(a) provides an expanded view for the coercivity plot that correspond to the Co bilayer. FIG. 9(b) shows an exemplary in-plane magnetization versus temperature measured at 500 Oe. There is an increase in the coercivity and a decrease in the magnetization between 200 and 140 K. For Ni, the coercivity increases by 115%, from 127 to 273 Oe at 200 and 140 K, respectively. The effect is smaller in the case of Co, but an observable coercivity increase exists from 76 to 89 Oe, e.g., as shown in the inset of FIG. 9(a).

FIG. 9(c) shows an exemplary coercivity vs. temperature plot for $V_2O_3$/Ni and $V_2O_3$/Fe bilayers. As noted earlier, the coercivity change can be tailored across the structural phase transition, e.g., from high to low values or vice-versa by growing ferromagnetic layers that have different values of the magnetostrictive coefficient, λ, (positive or negative) on top of Vanadium Oxides. FIG. 9(c) shows the evolution of the coercivity as a function of temperature for bilayers of 100 $V_2O_3$ and 10 nm of Nickel or Iron. For Nickel, there is a drop in coercivity across the SPT. Nickel (and cobalt) have a negative magnetostrictive coefficient, λ. On the other hand, polycrystalline iron has a positive magnetostrictive coefficient (at low magnetic fields). Therefore, for iron there is an increase in coercivity across the SPT, as shown in FIG. 9(c). The above results indicate that the main effect observed for $VO_2$/Ni bilayers is extended to different ferromagnetic layers coupled to materials where the SPT occurs at different temperatures. One application of the disclosed technology relates to implementation of improved data storage devices, such as magnetic recording systems that use heat-assisted recording by heating the materials to decrease the coercivity and then write the information. After that, cooling the material to increase the coercivity provides a more stable state where the information can be stored.

These large reproducible effects likely originate from the structural changes across the MIT. The (~0.32%) volume expansion in $VO_2$ or the (1.4%) volume decrease in $V_2O_3$ across the MIT produce epitaxial stress in the FM overlayer. In turn, the anisotropic stress in the FM layers changes the magnetic properties by the inverse magnetostrictive effect. This interfacial magnetoelastic effect provides a natural explanation for the thickness dependence of the coercivity increase (e.g., shown in FIG. 7(b)). Therefore, a thin Ni film is more sensitive to the interfacial stress and the changes in coercivity are larger than for a thicker film.

In addition to the atomic rearrangement due to the SPT, there are two additional parameters which may affect the interfacial stress in $VO_2$ samples: the coexistence of the rutile and monoclinic phases across the transition and the presence of twin boundaries in the RT monoclinic phase. These effects make it difficult to predict the exact epitaxial stress on the FM produced by $VO_2$. However, using the FM inverse magnetostrictive properties it is possible to estimate the type and magnitude of stress. Ni (and Co) has a negative magnetostriction coefficient, so it contracts when magnetized. Conversely, the magnetization increases (decreases) with compressive (tensile) stress. For Ni deposited at 420 K, the decrease in the magnetization when cooling across the SPT is an indication that the overall stress is tensile (e.g., see FIG. 8(b)). In contrast, for Ni deposited at RT the stress is compressive, as shown, e.g., by the increase in magnetization in the 350 to 320 K range in FIG. 8(b). For $V_2O_3$ bilayers, the magnetization decrease (see e.g., FIG. 9(b)) shows that the stress is tensile for both Ni and Co in cooling across the SPT. These changes in magnetization across the MIT are observed either with an applied field or in remanence. At remanence, the temperature was cycled twice heating and cooling and the curves overlap. This overlap in the magnetization curves with thermal cycling indicates the reversibility of the process and confirms that the stress in the FM layer is within the elastic limit.

The magnitude of stress needed to produce the variations in coercivity observed (e.g., as in FIG. 7(b)) for the 10 nm $VO_2$/10 nm Ni bilayer can be estimated as follows. The coercivity of a FM layer without stress has a linear dependence with temperature. Thus, without any stress the values of the coercivity at 320 K should be 105 Oe. This value is obtained by extrapolating to 320 K the coercivity values above the MIT. However, the observed value of the coercivity at 320 K is 236 Oe, 128 Oe larger. Assuming that the stress in the film is uniform and that the change in coercivity is caused by the stress anisotropy field given by:

$$H_{K\sigma} = \frac{3\lambda_{si}\sigma}{M_S}. \qquad (2)$$

In Equation (2), $\lambda_{si}$ is the saturation magnetostriction (for polycrystalline Ni $\lambda=-34\times10^{-6}$), $M_S$ is the saturation magnetization in G or emu/cm³ (300 emu/cm³ for our samples), and σ is the stress in MPa. Thus, to produce an anisotropy field of 128 Oe by this effect it is necessary to have σ=376 MPa. This value is close to those obtained from stress measurements in single $VO_2$ films across the SPT, supporting the idea that the effect is due to stress transferred from $VO_2$ to Ni. A similar calculation can be made for a $V_2O_3$/Ni bilayer. At 120 K, the difference between the real value of coercivity and the one extrapolated from the linear behavior is 128 Oe. $M_S$ for Ni on top of $V_2O_3$ is 400 emu/cm³ (see, e.g., FIG. 9(b). Then the stress value obtained is σ=500 MPa, a comparable value to $VO_2$. The differences between the Ni and Co bilayers observed in FIG. 9 arise from the different magnetic properties. $M_S$ in Co is approximately three times larger than Ni. The λ coefficient in polycrystalline Co is also negative but three times smaller than Ni. Thus, according to Equation (2), the stress induced anisotropy in Ni is up to nine times larger than Co for the same applied stress.

Therefore, the proximity effects provide a control mechanism of the magnetic properties of ferromagnetic layers grown on materials that undergo a MIT. Interfacial stress across the SPT is responsible for the magnetoelastic coupling which causes large changes in the coercivity and noticeable modifications of the magnetization due to an inverse magnetostrictive effect. The thickness and the deposition conditions of the FM Ni on the $VO_2$ provide the mechanism by which it is possible to control coercivity and magnetization. The use of $V_2O_3$ and Co shows that the effect is general for other FMs in contact with materials that undergo SPT.

In another aspect of the disclosed technology, materials with a controllable metal insulator transition (MIT) can be used as active layers in the read/write processes for magnetic memory devices or transistor device. These devices may be based on spin torque transfer or giant magneto resistance or of different nature.

In some implementations, the devices include a number of spacer layers, which can be used to separate between the properties of materials on either of their side. The disclosed technology can use spacer layers which are active, with controllable properties, in order to increase or enable the functionality of the device in question. For example, by changing the spacer layer between insulator to metal with an applied voltage, one can change from a read state to a write state of the device. Also, for example, in addition in this configuration the write state will be more stable to noise, and the read state will be easier to control.

Existing magnetic memory devices, both in practice and conceptually, have magnetic layers with various orientations. The difference between the orientations is what defines the state of the device (e.g., conventionally referred to as 0's and 1's). An example of a conventional implementation involves the change of the relative state between 2 ferromagnetic layers. One of these layers is pinned, i.e., its orientation does not change. This is usually achieved by coupling it to another antiferromagnetic layer. The other ferromagnetic layer can be changed between 2 orientations. Then, using the magneto-resistance effect, the state of the free layer can be found (either 1 or 0). When the free layer is in the same orientation as the pinned layer, the resistance across the device will be different than if they are in opposite orientations. There are various techniques to switch the free layer, and new techniques are continuously being developed. Currently, many existing devices include either a moving or a stationary local magnetic field, usually by running current in a wire, which can be controlled to change the state of the free magnetic layer. There is a constant search for increased performance of the reading and writing process, e.g., in which some of the main issues include speed, power consumption and stability. Also, the usage of the spin torque transfer method for writing magnetic random access memory devices is being investigated. The disclosed technology can be implemented in such writing magnetic random access memory devices, as described herein, as a method for writing the state of a magnetic RAM.

In some embodiments of the disclosed technology, one or more spacer layers are configured to be dynamic (e.g. rather than inert), and the implicit change of properties of this layer can change the state of a device (e.g., such as magnetic memory devices and spin valve devices) from read to write, or enables the write mode in the device. The spacer layer can be used to separate between ferromagnet layers (FM) or between ferromagnet and an anti-ferromagnet (AFM) layer. For example, the dynamic spacer layer can be configured as a normal metallic layer or a thin tunneling barrier. In such as case, for example, this layer is dynamic, and the implicit change of properties of this layer has the role of choosing between the write and read modes in the device and assisting in a stable operation of the device in the in either modes. For example, in a low current/low voltage mode, the spacer layer is in the insulating state and the resistance of the layer is orders of magnitudes larger than in the high current/higher voltage mode, which is the metallic phase of the material. The difference in currents between the two states can reach and exceed three orders of magnitude. Thus only above some threshold voltage does the active spacing layer enables the appearance of higher currents in the device which are necessary for the writing mode.

For example, in a different realization of the usage of this spacing layer, the two states of the spacing layer (metallic and insulator) assist in a more traditional write process, where there are separate current lines which make a magnetic field that is in charge of changing the state of the magnetic element. Here the role of the spacer layer states is to make the switching of the memory element from one state to the other easier.

For example, there are materials which have an insulator to metal phase transition (IMT) that can be induced by voltage. For low voltages the material is insulating (or semi-conducting), and above some critical voltage, or critical current, the material goes through a phase transition, and becomes metallic. The resistivity of the material can change by orders of magnitude. Metal insulator transitions with as much as seven orders of magnitude change in the resistivity were reported.

Exemplary materials that have a metal insulator transition can include, but are not limited to, $VO_2$, $V_2O_3$, $VO$, $V_6O_7$, $TiO_2O_3$, $NbO_2$, $Fe_2O_4$, $V_3O_5$, $V_4O_7$, NiSi, CrS, and FeS. For example, the metal insulator transition in some materials can be driven by a voltage. The disclosed technology includes using such a material as a dynamic spacer layer in a memory device. The ultra-fast switching of some of these materials (e.g., a few picoseconds for $VO_2$) makes these exemplary materials suitable in both hard disks and magnetic-RAM elements.

The following describes some exemplary devices that can be implemented using the disclosed technology. One Example device is a Magnetic and Insulator-Metal Transition (IMT) material memory device. The disclosed method and system include providing a number of magnetic elements and providing at least one spacer layer with a voltage induced IMT. Each of the plurality of magnetic elements is configured to be written using spin transfer. The at least one IMT layer can increase the current only during writing through at least one magnetic element, while the applied voltage is of the same order and only slightly higher. The higher current enables the magnetic layer to change during the writing process while the orders of magnitude lower reading current will not affect the magnetic element (neither heating nor high spin transfer).

Figure 10:
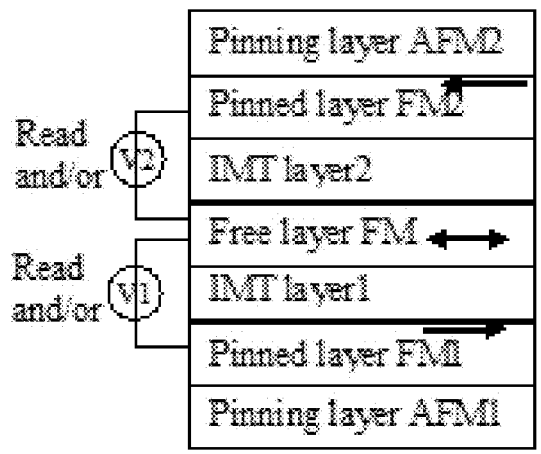
FIG. 10 shows a diagram illustrating an exemplary mechanism of the disclosed technology.

FIG. 10 shows a diagram that illustrates one implementation of the above described technology. For example, when in read mode, the voltage for measuring the MR between the free FM layer and FM1 keeps the IMT in an insulating state, so the current induced for the voltage is low, and the device is stable. In write mode, a voltage above a critical voltage is applied which is on the same order as the reading voltage, and only slightly higher (even 20%). This voltage will switch the resistance of the IMT layer to a much lower value, and for the same voltage a higher current will flow through the device. If the current is applied from FM1 then the free layer will change to the magnetic state of FM1 through the spin torque effect. If the current is applied through FM2 then the free layer will switch to the state of FM2 for the same reason.

One Example device is a Magnetic and IMT material memory device. The disclosed method and system include at least one pair of FM layers and/or at least one pair of FM and AFM layers which have at least one free FM element and at least one spacer layer between them made out of an IMT. Changing the IMT material from metallic to insulating will change the coupling between a free FM layer and another layer. In one implementation, this process itself will induce a coupling between the 2 layers causing the free layer to switch in a controlled fashion to the desired state.

Figure 11:
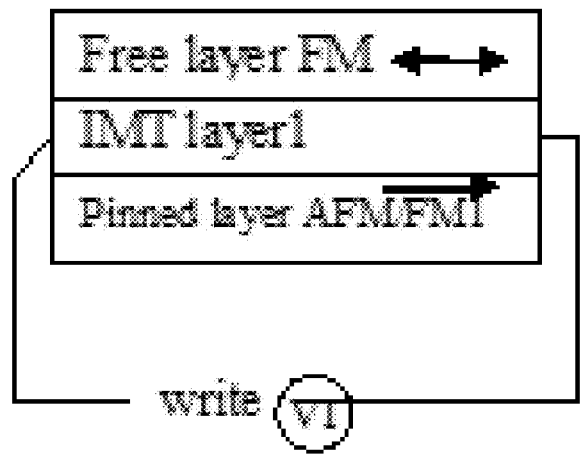
FIG. 11 shows a diagram illustrating an exemplary coupling mechanism of the disclosed technology.

FIG. 11 shows a diagram that illustrates one implementation of the above described coupling mechanism which will cause the free layer to switch. For example, when a voltage V1 is applied, layer 1 changes from insulating to metallic, enabling the free layer and the pinned layer to interact in a different fashion, enabling one to control the state of the free layer through this interaction. The precise way in which the free layer is then used as a memory device can follow one of the many ways mainly based on a particular form of magneto-resistance. For example, when V1 is turned off and the IMT returns to its off state the layers are decoupled again.

In some implementations, bilayers with smoother surface characteristics are produced. In particular, the growing conditions allowed smoother deposition of $V_2O_3$ films, as illustrated in FIG. 12. In FIG. 12(a) is an atomic force microcopy (AFM) image of a layer with an rms roughness of approximately 3 nm. FIG. 12(b) an AFM image of the newly produced layer (i.e., produced under new growing conditions) that has an rms roughness of approximately 1.5 nm. This reduction in roughness is confirmed by X-ray reflectivity (XRR) measurements, as are shown in FIGS. 12(c) and 12(d). In particular, FIG. 12(c) shows the XRR data (and fit) for the old samples with Ni roughness of 3 nm. FIG. 12(d) shows the XRR data (and fit) for the new samples with Ni roughness of 1.5 nm. By fitting the exemplary experimental data to a model it is possible to obtain information about thickness and roughness of the different films present in the multilayer.

Figure 13A:
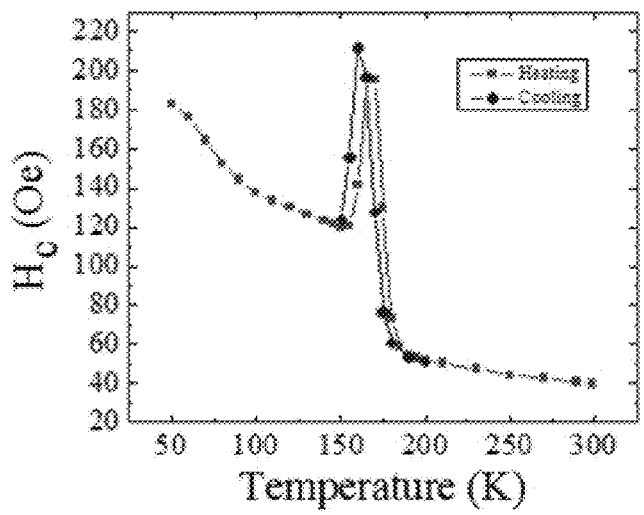
FIG. 13(a) shows exemplary data plots of coercivity vs. temperature for $V_2O_3$/Nickel smooth bilayers (for both cooling and heating cycles).
Figure 13B:
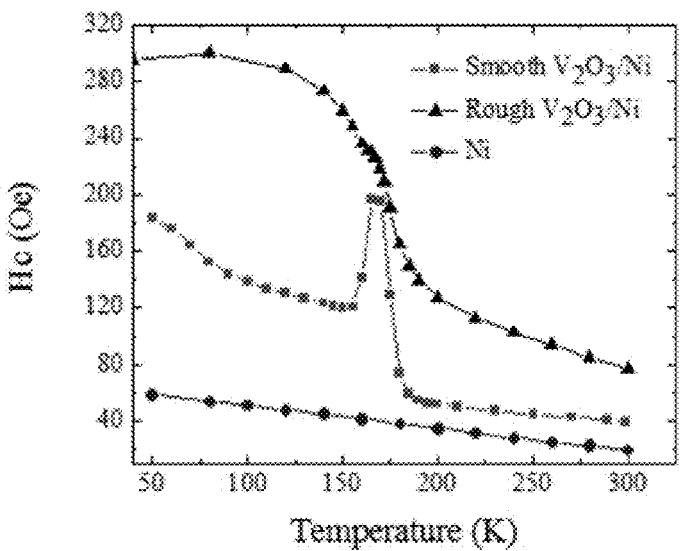
FIG. 13(b) shows exemplary data plots of comparison of the evolution of the coercivity with temperature for a single Ni film and two bilayers of $V_2O_3$/Ni with different roughness.

The smoother surfaces cause the bilayers to exhibit new magnetic properties. FIG. 13(a) provides an exemplary Coercivity vs. temperature plot for $V_2O_3$/Nickel smooth bilayers (for both cooling and heating cycles). As evident from FIG. 13(a), in addition to an increase in the coercivity from high to low temperatures, a sudden enhancement in the middle of the transition (e.g., around 165 K) is produced. At these exemplary temperatures, the values of the coercivity reach a maximum value (e.g., a coercivity value in the range of approximately 200 to 210 $O_e$ in the exemplary bilayer of FIG. 13(a)). FIG. 13(b) shows a plot of an exemplary comparison of the evolution of the coercivity with temperature for a single Ni film and two bilayers of $V_2O_3$/Ni with different roughness. In particular, the plot in FIG. 13(b) that is identified with triangles corresponds to a rougher $V_2O_3$/Ni bilayer compared to the plot that is identified with squares. The plot with circles (i.e., the bottom-most plot in FIG. 13(b) corresponds to a single Ni layer). As shown in this example of FIG. 13(b), the coercivity enhancement in the middle of the transition is only visible in the bilayer structure with smoother films. The exemplary results presented herein demonstrate surface smoothness can be used as another tool for controlling the magnetic properties (e.g., coercivity and/or magnetization) of Metal Insulator materials and ferromagnetic layer. Thus, by tailoring the film roughness, the magnetic properties of the bilayers can be controlled.

The present technology can also be used in devices where one needs to control the currents running through the device for another reason, e.g., where one of the states is a low current state and the other a high current that could be a few orders of magnitude larger than the low current, but using very similar voltages and a well-defined transition point.

For example, vanadium oxide ($VO_2$) can be used for thin films of the disclosed technology. The disclosed technology can include an exemplary magneto-resistive device made of ferromagnetic electrodes and including a spacer layer made of $VO_2$. Methods of fabrication of the exemplary device can include depositing thin films with metal insulator transition characteristics (e.g., such as $VO_2$) on various surfaces. The methods include monitoring changes in the state of the exemplary $VO_2$ thin film between metallic and insulating by applying a critical voltage. For example, the voltage can result in a current of ~106 A/cm2, which is on the same order of magnitude as necessary for spin torque transfer devices.

In one aspect of the disclosed technology, a method to control a property of an engineered material can be implanted that includes forming a layer of a magnetic material on a first material having a magnetostrictive property to produce a composite material and performing at least one of the following steps: applying a magnetic field to the composite material to produce a mechanical stress to change a dimension of the composite material that alters a magnetic property of the composite material, or heating the composite material to induce at least one of a structural phase transition or a metal-inductor transition on the first material that alters the magnetic property and an electrical property of the composite material. As part of forming the layer, the thickness of the layer and the first material can be controlled. The magnetic property can include coercive field and the electrical property can include resistivity. The first material can be selected based on the magnetostrictive property having a magnetostrictive coefficient value. For example, the magnetostrictive property can include a negative magnetostrictive coefficient, and the mechanical stress includes a compressive stress for contracting the composite material. In this example, contracting the composite material increases magnetization of the composite material. In another example, magnetostrictive property includes a positive magnetostrictive coefficient, and the mechanical stress includes a tensile stress for elongating the composite material. In this particular example, elongating decreases magnetization of the composite material.

Figure 14:
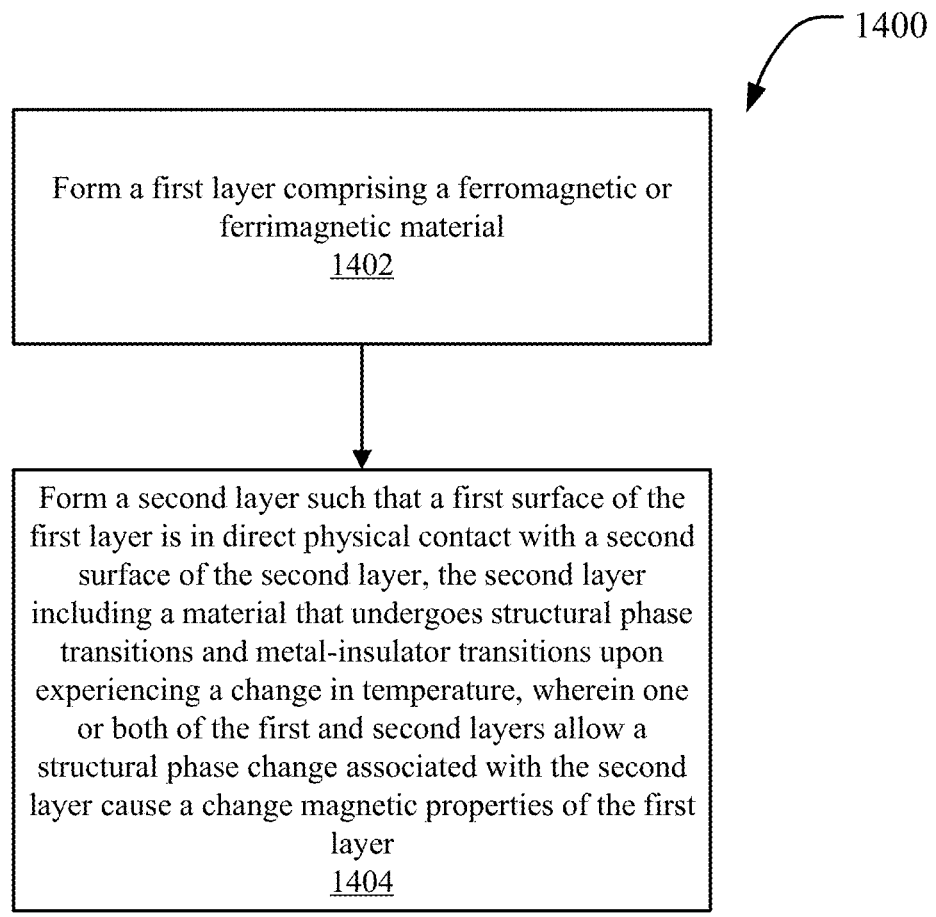
FIG. 14 illustrates a set of operations that can be carried out to form a multi-layer structure in accordance with an exemplary embodiment.

FIG. 14 illustrates a set of operations 1400 that can be carried out to form a multi-layer structure in accordance with an exemplary embodiment. At 1402, a first layer is formed that includes a ferromagnetic or ferrimagnetic material. At 1404, a second layer is formed such that a first surface of the first layer is in direct physical contact with a second surface of the second layer. The second layer includes a material that undergoes structural phase transitions and metal-insulator transitions upon experiencing a change in temperature, and one or both of the first and second layers allow a structural phase change associated with the second layer cause a change magnetic properties of the first layer.

In one exemplary, the magnetic properties includes one or both of coercivity or magnetism of the first layer. The change in magnetic properties of the first layer is greater than a change in the same magnetic properties of the first layer when the second layer is absent. In some implementations, the second layer comprises a vanadium compound. The second layer can include at least one of $TiO_3$, $Ti_3O_5$, $NbO_2$, $Fe_3O_4$, $Mo_9O_{26}$, NiS, CrS, VS, FeS, $NiS_{2-x}Se_x$, $RNiO_3$, $NiS_{1-x}Se_x$, $BaVS_3$, $La_{1-x}Sr_xFeO_3$, FeSi, or $LaCoO_3$. In another example, the first layer comprises one of iron, nickel, copper, or cobalt.

In one implementation, forming the second layer comprises forming the second to have a particular thickness to allow structural phase transitions caused by a change in temperature cause a change in magnetic properties of the first layer. In one implementation, one or both of the first surface of the first layer or the second surface of the second layer is formed to have a particular roughness so as to produce a particular change in the magnetic properties of the first layer as a result of structural phase transitions in the second layer.

In yet another implementation, the first layer includes a material with a particular magnetostricitive coefficient, and the material of the second layer is selected to produce one, but not both, of a tensile or compressive stress in the first layer as a result of structural phase transitions in the second layer. Specifically, the particular magnetostricitive coefficient and the material of the second layer are selected to satisfy one of the following: (a) the particular magnetostricitive coefficient has a positive value, and the second layer produces a tensile stress to thereby produce a positive change in coercivity of the first layer, (b) the particular magnetostricitive coefficient has a negative value, and the second layer produces a tensile stress to thereby produce a negative change in coercivity of the first layer, (c) the particular magnetostricitive coefficient has a positive value, and the second layer produces a compressive stress to thereby produce a negative change in coercivity of the first layer, or (d) the particular magnetostricitive coefficient has a negative value, and the second layer produces a compressive stress to thereby produce a positive change in coercivity of the first layer.

In one example, the material in the second layer undergoes metal-insulator transitions upon experiencing the change in temperature, and one or both of the first and second layers are formed to allow the metal-insulator transition associated with a second layer cause a change electrical properties of the multi-layer structure. In particular, the change in electrical properties includes a change in resistivity of the multi-layer structure.

In the above noted method, controlling the change in magnetic properties of the first layer by selecting one or more of the following: a particular thickness for the second layer, a particular roughness of the first surface of the first layer, a particular roughness of the second surface of the second layer, a material having a particular magnetostricitive coefficient to be included in the first layer, or a material to be included in the second layer that produces either a tensile or a compressive stress upon undergoing structural phase transitions.

In one example, the above noted method also includes controlling a change in an electrical property of the multi-layer structure by selecting a material to be included in the second layer that has a first resistivity value when in an insulating state and a second resistivity value when in metallic state. In another example, forming the first layer comprises growing the first layer on top of second surface of the second layer.

The disclosed techniques enables implementation of novel structures and devices. For example, one aspect of the disclosed technology relates to multi-layer structure that includes a first layer comprising a ferromagnetic or ferrimagnetic material, and a second layer positioned within the multi-layer structure such that a first surface of the first layer is in direct physical contact with a second surface of the second layer. The second layer including a material that undergoes structural phase transitions and metal-insulator transitions upon experiencing a change in temperature. Further, one or both of the first and second layers are structured to allow a structural phase change associated with the second layer cause a change magnetic properties of the first layer. In this multi-layer structure the magnetic properties that can change include one or both of coercivity or magnetism of the first layer. As noted earlier, in one example, the second layer comprises a vanadium compound. In one example, the first layer comprises one of iron, nickel, copper, or cobalt. In one example, the second layer is dimensioned to have a particular thickness to allow structural phase transitions caused by a change in temperature cause a change in magnetic properties of the first layer. In this multi-layer structure, the change in magnetic properties of the first layer is greater than a change in the same magnetic properties of the first layer when the second layer is absent.

In one example, one or both of the first surface of the first layer or the second surface of the second layer is structured to have a particular roughness so as to produce a particular change in the magnetic properties of the first layer as a result of structural phase transitions in the second layer. In another example, the first layer includes a material with a particular magnetostricitive coefficient, and the material of the second layer is selected to produce one, but not both, of a tensile or compressive stress in the first layer as a result of structural phase transitions in the second layer. In yet another example, the material in the second layer undergoes metal-insulator transitions upon experiencing the change in temperature, and one or both of the first and second layers are structured to allow the metal-insulator transition associated with a second layer cause a change in electrical properties, such as resistivity, of the multi- layer structure.

Another aspect of the disclosed technology relates to an electronic device that includes a multi-layer structure including a first layer comprising a ferromagnetic or ferrimagnetic material, and a second layer positioned within the multi-layer structure such that a first surface of the first layer is in direct physical contact with a second surface of the second layer. The second layer includes a material that undergoes structural phase transitions or metal-insulator transitions, and one or both of the first and second layers are structured to allow a structural phase change or an insulation property change associated with the second layer cause a change in magnetic properties of the first layer. The above noted electronic device also includes an electrical or optical source operable to cause a structural phase transition, a metal-insulator transition or an insulator to metal transition to occur in the second layer of the multi-layer structure. For example, such an electronic device can be one of a magnetic memory device or a magnetic transistor device.

In one example, the electrical or optical source is a laser operable to selectively turn on or off to produce a particular change in temperature in one or more sections of the multi-layer structure and to thereby cause a structural phase change in the second layer. For example, the laser can be operable to selectively cause a different temperature change to be produced at each of the one or more sections of the multi-layer structure. In another example, the electrical or optical source is a heating source that causes a temperature change in one or more sections of the multi-layer structure. In yet another example, the electrical or optical source is a voltage source operable to selectively establish different voltage values across the second layer and to cause metal to insulator transitions or insulator to metal transitions to occur in the second layer. In still another example, the electrical or optical source is a current source operable to selectively allow different current values to flow through the second layer and to cause metal to insulator transitions or insulator to metal transitions to occur in the second layer.

In one exemplary implementation, the electronic device is a spin torque transfer magnetic memory device and the first layer is configured as a free layer and the second layer is configured as a dynamic spacer layer, where an insulator to metal transition or a metal to insulator transition in the dynamic layer causes a change in magnetization of the free layer. For example, one of the insulator to metal transition or the metal to insulator transition in the dynamic layer allows reading of a stored value from the spin torque transfer magnetic memory device and the other of the insulator to metal transition or the metal to insulator transition in the dynamic layer allows writing of a value to the spin torque transfer magnetic memory device.

In another example, the above noted electronic device further includes a pinned ferromagnetic layer that is positioned within the multi-layer structure such that one surface of the pinned ferromagnetic layer is in contact with a first surface of the second layer.

While this patent document contain many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A multi-layer structure, comprising:
   a first layer comprising a ferromagnetic or ferrimagnetic material; and
   a second layer positioned within the multi-layer structure such that a first surface of the first layer is in direct physical contact with a second surface of the second layer, the second layer including a material that undergoes structural phase transitions and metal-insulator transitions upon experiencing a change in temperature, wherein one or both of the first and second layers are structured to allow a structural phase change associated with the second layer cause a change magnetic properties of the first layer.

2. The multi-layer structure of claim 1, wherein the magnetic properties include one or both of coercivity or magnetism of the first layer.

3. The multi-layer structure of claim 1, wherein the second layer comprises a vanadium compound.

4. The multi-layer structure of claim 1, wherein the first layer comprises one of iron, nickel, copper, or cobalt.

5. The multi-layer structure of claim 1, wherein the second layer is dimensioned to have a particular thickness to allow structural phase transitions caused by a change in temperature cause a change in magnetic properties of the first layer.

6. The multi-layer structure of claim 5, wherein the change in magnetic properties of the first layer is greater than a change in the same magnetic properties of the first layer when the second layer is absent.

7. The multi-layer structure of claim 1, wherein one or both of the first surface of the first layer or the second surface of the second layer is structured to have a particular roughness so as to produce a particular change in the magnetic properties of the first layer as a result of structural phase transitions in the second layer.

8. The multi-layer structure of claim 1, wherein the first layer includes a material with a particular magnetostricitive coefficient, and the material of the second layer is selected to produce one, but not both, of a tensile or compressive stress in the first layer as a result of structural phase transitions in the second layer.

9. The multi-layer structure of claim 8, wherein the particular magnetostricitive coefficient and the material of the second layer are selected to satisfy one of the following:
   (a) the particular magnetostricitive coefficient has a positive value, and the second layer produces a tensile stress to thereby produce a positive change in coercivity of the first layer,
   (b) the particular magnetostricitive coefficient has a negative value, and the second layer produces a tensile stress to thereby produce a negative change in coercivity of the first layer,
   (c) the particular magnetostricitive coefficient has a positive value, and the second layer produces a compressive stress to thereby produce a negative change in coercivity of the first layer, or
   (d) the particular magnetostricitive coefficient has a negative value, and the second layer produces a compressive stress to thereby produce a positive change in coercivity of the first layer.

10. The multi-layer structure of claim 1, wherein the material in the second layer undergoes metal-insulator transitions upon experiencing the change in temperature, and wherein one or both of the first and second layers are structured to allow the metal-insulator transition associated with a second layer cause a change in electrical properties of the multi-layer structure.

11. The multi-layer structure of claim 10, wherein the change in electrical properties includes a change in resistivity of the multi-layer structure.

12. The multi-layer structure of claim 1, wherein the second layer includes at least one of $TiO_3$, $Ti_3O_5$, $NbO_2$, $Fe_3O_4$, $Mo_9O_{26}$, NiS, CrS, VS, FeS, $NiS_{2-x}Se_x$, $RNiO_3$, $NiS_{1-x}Se_x$, $BaVS_3$, $La_{1-x}Sr_xFeO_3$, FeSi, or $LaCoO_3$.

13. An electronic device, comprising:
   a multi-layer structure including:
      a first layer comprising a ferromagnetic or ferrimagnetic material; and
      a second layer positioned within the multi-layer structure such that a first surface of the first layer is in direct physical contact with a second surface of the second layer, the second layer including a material that undergoes structural phase transitions or metal-insulator transitions, wherein one or both of the first and second layers are structured to allow a structural phase change or an insulation property change associated with the second layer cause a change in magnetic properties of the first layer;
   an electrical or optical source operable to cause a structural phase transition, a metal-insulator transition or an insulator to metal transition to occur in the second layer of the multi-layer structure.

14. The electronic device of claim 13, wherein the electronic device is one of a magnetic memory device or a magnetic transistor device.

15. The electronic device of claim 13, wherein the electrical or optical source is a laser operable to selectively turn on or off to produce a particular change in temperature in one or more sections of the multi-layer structure and to thereby cause a structural phase change in the second layer.

16. The electronic device of claim 15, wherein the laser is operable to selectively cause a different temperature change to be produced at each of the one or more sections of the multi-layer structure.

17. The electronic device of claim 13, wherein the electrical or optical source is a heating source that causes a temperature change in one or more sections of the multi-layer structure.

18. The electronic device of claim 13, wherein the electrical or optical source is a voltage source operable to selectively establish different voltage values across the second layer and to cause metal to insulator transitions or insulator to metal transitions to occur in the second layer.

19. The electronic device of claim 13, wherein the electrical or optical source is a current source operable to selectively allow different current values to flow through the second layer and to cause metal to insulator transitions or insulator to metal transitions to occur in the second layer.

20. The electronic device of claim 13, wherein the electronic device is a spin torque transfer magnetic memory device and the first layer is configured as a free layer and the second layer is configured as a dynamic spacer layer, and wherein an insulator to metal transition or a metal to insulator transition in the dynamic layer causes a change in magnetization of the free layer.

21. The electronic device of claim 20, wherein one of the insulator to metal transition or the metal to insulator transition in the dynamic layer allows reading of a stored value from the spin torque transfer magnetic memory device and the other of the insulator to metal transition or the metal to insulator transition in the dynamic layer allows writing of a value to the spin torque transfer magnetic memory device.

22. The electronic device of claim 20, further comprising a pinned ferromagnetic layer that is positioned within the multi-layer structure such that one surface of the pinned ferromagnetic layer is in contact with a first surface of the second layer.

23. The electronic device of claim 13, wherein the magnetic properties include one or both of coercivity or magnetism of the first layer.

24. The electronic device of claim 13, wherein the second layer comprises a vanadium compound.

25. The electronic device of claim 13, wherein the first layer includes at least one of $VO_2$, $V_2O_3$, $VO$, $V_6O_7$, $Ti_2O_3$, $NbO_2$, $Fe_2O_4$, $V_3O_5$, $V_4O_7$, $NiSi$, $CrS$, or $FeS$.

26. The electronic device of claim 13, wherein the first layer comprises one of iron, nickel, copper, or cobalt.

27. The electronic device of claim 13, wherein the second layer includes at least one of $TiO_3$, $Ti_3O_5$, $NbO_2$, $Fe_3O_4$, $Mo_9O_{26}$, $NiS$, $CrS$, $VS$, $FeS$, $NiS_{2-x}Se_x$, $RNiO_3$, $NiS_{1-x}Se_x$, $BaVS_3$, $La_{1-x}Sr_xFeO_3$, $FeSi$, or $LaCoO_3$.

* * * * *